United States Patent [19]
Lawless

[11] Patent Number: 5,183,965
[45] Date of Patent: Feb. 2, 1993

[54] CERAMIC SUPERCONDUCTING DOWNLEAD

[76] Inventor: William N. Lawless, c/o CeramPhysics, Inc. 921 Eastwind Dr., Ste. 110, Westerville, Ohio 43081

[21] Appl. No.: 562,222

[22] Filed: Aug. 3, 1990

[51] Int. Cl.⁵ ............... H01B 12/00; H04B 1/00
[52] U.S. Cl. .................. 174/15.5; 174/15.4; 174/125.1; 505/1; 505/704; 505/826; 505/856; 505/884; 505/885; 505/886; 505/887
[58] Field of Search .......... 174/125.1, 15.4, 15.5; 29/599; 505/1, 701, 704, 826, 856, 884, 885, 886, 887

[56] References Cited

U.S. PATENT DOCUMENTS

| | | | |
|---|---|---|---|
| 3,710,000 | 1/1973 | Shattes et al. ............ | 174/15.5 |
| 3,790,654 | 2/1974 | Bagley . | |
| 3,958,327 | 5/1976 | Marancik et al. .......... | 174/125.1 |
| 3,963,425 | 6/1976 | Sambrook ................. | 29/191.4 |
| 4,625,192 | 11/1986 | Kawaguchi ............... | 174/15.5 |
| 4,723,355 | 2/1988 | Both et al. ................ | 29/599 |
| 4,810,554 | 3/1989 | Hattori et al. . | |
| 4,840,827 | 6/1989 | Mizutani et al. . | |
| 4,863,804 | 9/1989 | Whitlou et al. ........... | 428/555 |
| 4,965,246 | 10/1990 | Suzawa ..................... | 505/1 |
| 4,980,972 | 1/1991 | Singh et al. ............... | 29/872 |
| 5,047,388 | 9/1991 | Rohr et al. ................ | 505/1 |

OTHER PUBLICATIONS

Science, "Superconductivity: Is the Party Over?", vol. 24, May 26, 1989, pp. 914–916.
Takeya et al., Japanese Journal of Applied Physics, Feb. 1989, pp. L229–L23.
Ehara et al., "Dielectric Properties of $Bi_4Ti_3O_{12}$ below the Curie Temperature," May 1981, pp. 877–881.
W. N. Lawless, "Glasslike Properties of Ferroelectrics at Low Temperatures," vol. 43, pp. 223–228, 1982.
I. M. Lachman et al., "Thermal Expansion of Extruded Cordierite Ceramics," 1981, vol. 60, No. 2, pp. 202–205.
Swartz et al., "Fabrication of Grain-Oriented $PbBi_2Nb_2O_9$," 1983, pp. 881–884.
R. M. Hazen et al., "Superconductivity in the High-$T_c$-Bi-Ca-Si-Cu-O System": Phase Identification, 1988, pp. 1174–1177.

Primary Examiner—Leo P. Picard
Assistant Examiner—Bot L. Ledynh
Attorney, Agent, or Firm—Killworth, Gottman, Hagan & Schaeff

[57] ABSTRACT

An electrical conductor particularly suited for use as a downlead to low temperature devices includes a ceramic honeycomb body having longitudinal channels wherein films of substantially single crystals of a ceramic superconductor are grown. The maximum current carrying capacity of the ceramic superconductor may be oriented parallel to the channels. Square channels arranged in alternating rows of oppositely directed current provide desirable magnetic field cancellations and permit high current flows. A method for making the electrical conductor and a method of extruding the ceramic honeycomb body are also disclosed.

48 Claims, 9 Drawing Sheets

CERAMIC SUPERCONDUCTING DOWNLEAD

BACKGROUND OF THE INVENTION

This invention relates to the conduction of electricity at low temperatures, and in particular to a downlead of superconducting ceramic material for thermally efficient supply of large currents to devices designed to operate at low temperatures.

Devices designed to store large amounts of energy at low temperatures, such as superconducting magnets operating at 4.2K or below (approximately liquid helium temperature), are driven by large currents (e.g. 75 kiloamps.) which are generated at room temperature. Typically these currents are transmitted by copper busbars from 300K (approximately room temperature) down to 4.2K. Liquid nitrogen is used to cool the busbars from 300K to 77K, and liquid helium is used to further cool the busbars from 77K to 4.2K. Significant evaporative loss of liquid helium has been experienced with conventional copper busbars due to thermal conduction and $I^2R$ power dissipation in the busbars under conditions of such large currents. Such losses increase system refrigeration requirements and are economically undesirable.

The discovery of ceramic superconductors having high transition temperatures (generally above 90K) led to the concept of using a ceramic superconducting downleads to carry current from 77 to 4.2K or below to minimize the undesirable helium evaporation losses associated with conventional normal metal busbars, for example, copper or aluminum busbars.

Ceramic superconductors are considered advantageous for downleads because, being ceramic, they have low thermal conductance compared to copper busbars, and being superconductors, they virtually eliminate $I^2R$ power losses experienced with copper busbars. Consumption of liquid helium by evaporation, may thereby be reduced to very low levels, making such downleads attractive for both space and terrestrial applications.

While the use of superconducting ceramics for downleads promises to reduce system thermal loads, problems exist with the practical application of such materials in downlead structures. Significant production problems have prevented the development of "wire-like" ceramic superconductors. As well, thermal considerations remain important. Initially, the thermal conductance of the ceramic downlead, while small in comparison to copper, must still be controlled by providing that the heat exchange between the downlead structure and the gaseous helium generated by evaporation be such that the downlead will efficiently use the heat capacity of the evaporated gaseous helium to cool it.

A further problem in the practical use of superconducting ceramics is presented by the effect of magnetic fields on superconductivity. Superconductivity can be destroyed by increasing the magnetic field around the material to a value at which the normal conductive state is restored. Referred to as the threshold field, this magnetic field may be produced by an external source, for example neighboring downleads or equipment, or may be self-induced, produced by electric current flowing in the superconductor itself. As long as the flux lines of such magnetic fields are "pinned" as is known in the art, they do not contribute to the resistivity of the superconductor. However, these flux lines can be "de-pinned" thermally. The temperature at which such "de-pinning" or "flux melting" occurs depends on the superconducting ceramic used. When superconductivity is destroyed, $I^2R$ losses will greatly increase the evaporation of liquid helium and the significant advantage presented by ceramic superconductors is thereby lost.

Thus, there is a need for a downlead structure for superconducting ceramics which affords low thermal conductivity, provides efficient heat exchange with coolants and minimizes self-induced magnetic fields.

SUMMARY OF THE INVENTION

The present invention meets the need for an electrical conductor of superconducting ceramics having desirable thermal and magnetic characteristics which permit relatively high current flows of substantially 75 kiloamps (K amps).

According to a first aspect of the present invention, a honeycomb structure is disclosed in which superconducting ceramics carry current in a plurality of channels cooled below transition temperatures. The honeycomb geometry can be optimized to minimize thermal conductance and resulting evaporative loss of liquid helium coolant. The deleterious self-induced magnetic fields and the superconducting ceramics are reduced because the plurality of current-carrying channels may be arranged to achieve desirable field cancellations.

Particularly suited for a downlead for low temperature devices, is a honeycomb structure having a plurality of longitudinal channels. In the discussion which follows, the longitudinal channels will simply be referred to as channels. Ceramic honeycombs have been successfully extruded in the art, as shown variously by Mizutani et al, U.S. Pat. No. 4,840,827, Hattori et al, U.S. Pat. No. 4,810,554, and R. D. Bagley, U.S. Pat. No. 3,790,654. Honeycombs may also be made by other methods known in the art, such as by corrugating tapecast sheets alternately between flat layers. The thin longitudinal walls of the honeycomb can be arranged to minimize the overall cross-sectional area of ceramic material to reduce thermal conductance and resulting loss of liquid helium, and the large number of channels insure a large surface area to maximize heat transfer between the downlead and the evaporated gaseous helium as it ascends through the channels of the honeycomb. These efficiencies, as well as the strength of the honeycomb design, make such structures particularly suited for use as the body of a downlead.

In a first embodiment of the present invention a ceramic honeycomb body is made entirely of a high temperature superconducting ceramic wherein current is carried in the outermost surface layer along the channel surfaces. In a second, preferred, embodiment, the present invention comprises a non-superconducting ceramic honeycomb body wherein the channel surfaces are covered with a film or layer of a high temperature superconducting ceramic. As discussed in more detail below, positive or negative current may be carried in the outermost surface layers or films deposited in each channel.

It has been determined that the geometry of the honeycomb body and channels, and pattern of current flow in the channels may be arranged to reduce magnetic field effects on the superconducting films or surface layers. The current flow in the channels may be grouped so that net magnetic fields generated by the current flow cancel, eliminating the problems associated with flux melting. For example, in either the first or second, preferred, embodiment of the present invention, a honeycomb design is provided wherein the magnetic fields generated by oppositely directed currents substantially cancel, and/or do not combine. As a result of such design, self-induced magnetic fields may be reduced to the point of cancellation at the midpoint of the film or surface layer, and the net magnetic fields are also maintained below threshold fields which would otherwise destroy superconductivity throughout the films of the superconducting ceramic.

In the preferred embodiment of the present invention an important feature is that the ceramic honeycomb body exhibits a crystal lattice structure compatible with the crystal lattice structure of the superconducting ceramic film. Such compatibility preferably includes substantially matching lattice constants. As a result, substantially single crystal films of the superconductors may be grown on the channel walls of the honeycomb body. Non-single crystal films may be grown and used, but single crystals exhibit the highest capacity for current flow. It is known that the current carrying capacity of ceramic superconductors varies with the axis of the crystal lattice. Thus, a second important feature of the preferred embodiment is that the ceramic honeycomb body be preferentially grain-oriented so that the corresponding axis or plane of the superconducting film has the maximum current carrying capacity oriented parallel to the extrusion direction.

While a number of ceramic honeycomb materials and superconducting ceramics may exhibit such compatible lattice structures, the preferred embodiment of the invention utilizes a $Bi_3Ti_4O_{12}$ (BT) honeycomb body and a single crystal film of BiCaSrCu-Oxide superconductor. The characteristics of these ceramics made them particularly suited to practice the preferred embodiment.

Honeycombs of BT have been successfully extruded by methods known in the art. While not all ceramic honeycombs have the axial orientation of BT crystallites needed to practice the preferred embodiment of the present invention, BT crystallizes in the form of mica-like platelets where the C-axis is perpendicular to the plane of the platelets. By virtue thereof, extrusion of platy BT powders will result in a honeycomb where the a-b plane of BT is oriented parallel to the extrusion direction. This orientation effect during the extrusion of platy powders of a cordierite composition has been reported by I. M. Lachman et al [Ceramic Bulletin, No. 2, page 202, 1981]. The preferred orientation of platy powders of BT during tape-casting has been reported by S. L. Swartz et al. [Ferroelectrics, Vol. 38, page 765, 1981, and J. Amer. Cer. Soc. Vol. 66, page 881, 1983].

Because an almost exact match exists between the lattice constants of BT and the high temperature ceramic superconductor BiCaSrCu-oxide (BCSCO), substantially single crystal films of BCSCO up to 10 microns thick can be grown on the walls of the BT honeycomb by methods such as liquid-phase-epitaxy methods (LPE) known in the art. As the superconducting films are relatively much smaller than the cross sectional area of BT, the overall thermal conductance of the downlead will be dominated by the BT ceramic rather than the BCSCO film. Conveniently, the maximum current carrying capacity of BCSCO is exhibited in the a-b plane, and thus will be oriented parallel to the direction of extrusion.

In the preferred embodiment, a cylindrical ceramic honeycomb body contains oppositely directed currents directed through channels of square cross-section. The channels are grouped in a striped pattern of alternating rows across the face of the ceramic honeycomb body. The consecutive "stripes" carry oppositely-directed currents which may, in aggregate, feed in excess of 75K amps into and out of the superconducting device at or below 4.2K. Square channels are preferred because of the symmetry and the symmetrical fields which result, and a striped design is preferred because of the favorable field cancellations which result. Self-induced fields may be reduced to the point of cancellation at the midpoint of the superconducting film. The precise geometry preferred, in cross-section of the ceramic honeycomb body, comprises square channels of width 2t, separated by longitudinal walls having a thickness of $\sqrt{5}t$, where t is defined as the half-width of a honeycomb channel.

In the first embodiment of the present invention, the entire ceramic honeycomb body is comprised of high temperature superconducting ceramic such as BCSCO. BCSCO also exhibits mica-like platelet properties and may similarly be extruded to form honeycombs. In this embodiment, the outermost surface layers of the longitudinal channels of the extrusion act as the film. Alternatively, in this embodiment a single crystal film of BCSCO superconductor is grown on the extruded BCSBO honeycomb in the manner described above. In either case, positive or negative current may be carried in separate channels, as described above, to achieve favorable magnetic field cancellations in the downlead.

The ceramic honeycomb body of the present invention provides an advantageous design because of the mechanical strength of honeycombs and support for the superconducting films used in the preferred embodiment; low thermal conductance due to its geometry as well as material choices; large surface area in its channels for heat transfer; and a highly symmetric structure favorable for field cancellations. As a result the honeycomb structure provides a thermally efficient structure particularly suited for use as a downlead.

According to a second aspect of the invention, a method of producing the ceramic superconducting downlead is provided which comprises the steps of extruding a ceramic honeycomb body having a plurality of parallel longitudinal channels; and growing one or more substantially single-crystal films of ceramic superconductor having a substantially identical lattice structure to that of the ceramic honeycomb body, on one or more surfaces of one or more of the longitudinal channels.

While the present invention is described as preferably made of a ceramic honeycomb of BT and ceramic superconductor of BCSCO grown in single crystals in a-b plane-oriented longitudinal channels, it may, in similar fashion be practiced with other ceramic honeycombs and ceramic superconductors having substantially matching lattice constants.

Accordingly, it is an object of the present invention to provide an electrical conductor of superconducting ceramics having desirable thermal and magnetic characteristics suitable for high electric current flows for use as a downlead to superconducting devices.

DETAILED DESCRIPTION OF THE PREFERRED EMBODIMENT

Figure 1:
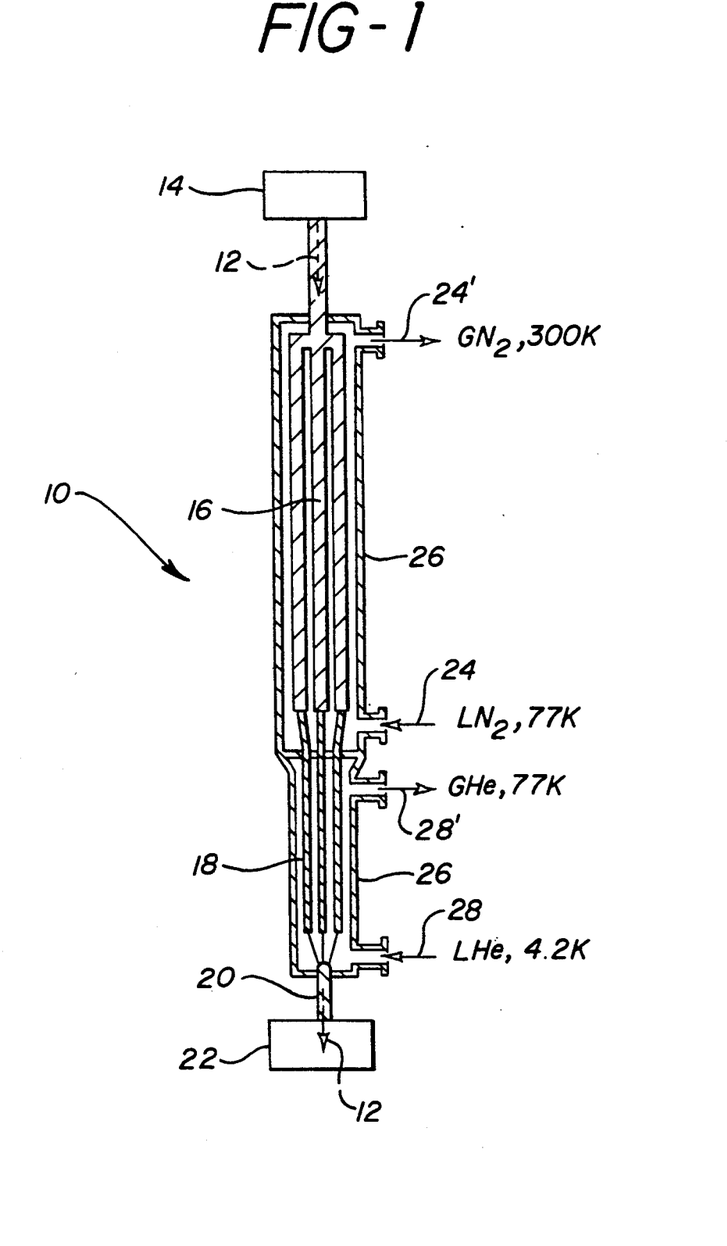
FIG. 1 is a schematic of a system showing a downlead as used between a metallic electrical conductor and a low temperature device.

An electrical conductor of a superconducting ceramic material is shown in FIG. 1 as downlead 18 in system 10. Typifying systems applications involving low temperature devices, FIG. 1 shows current 12 flowing from power source 14 through copper busbars 16 at generally 300K to 77K, and through downleads 18 at generally 77K to 4.2K or below, to a low temperature device 22. Device 22 may be, for example, a superconducting magnet which is connected by superconducting leads 20, typically of NbTi, to downlead 18. Preferably only one downlead 18 of superconducting ceramic material as described, rather than three, as shown in FIG. 1, will be used.

As further shown in FIG. 1, cryogens, typically liquid nitrogen and liquid helium, are used to provide refrigeration needed in such systems. Liquid nitrogen 24 is shown entering dewar 26 at about 77K, and exiting dewar 26 as gaseous nitrogen 24' at about 300K. Liquid helium 28 is shown circulating in a second part of dewar 26 where it enters at generally 4.2K and exits as gaseous helium 28' at about 77K. Such arrangements take advantage of both the heat of vaporization and the heat capacity of the rising gas for cooling.

Figure 2:
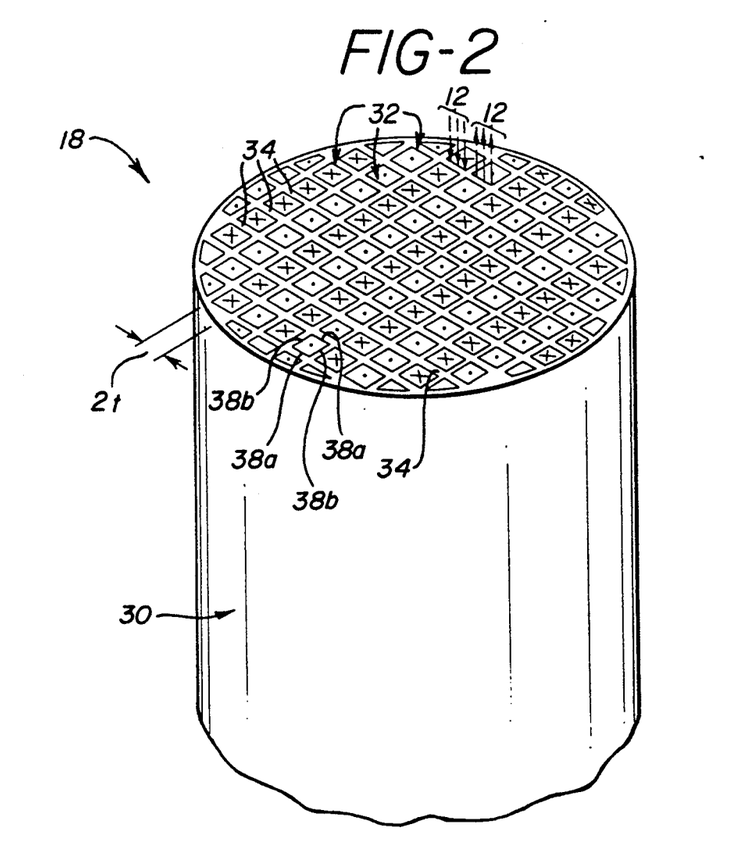
FIG. 2 is a perspective view of the preferred embodiment of the present invention showing the ceramic honeycomb with superconducting films.
Figure 2A:
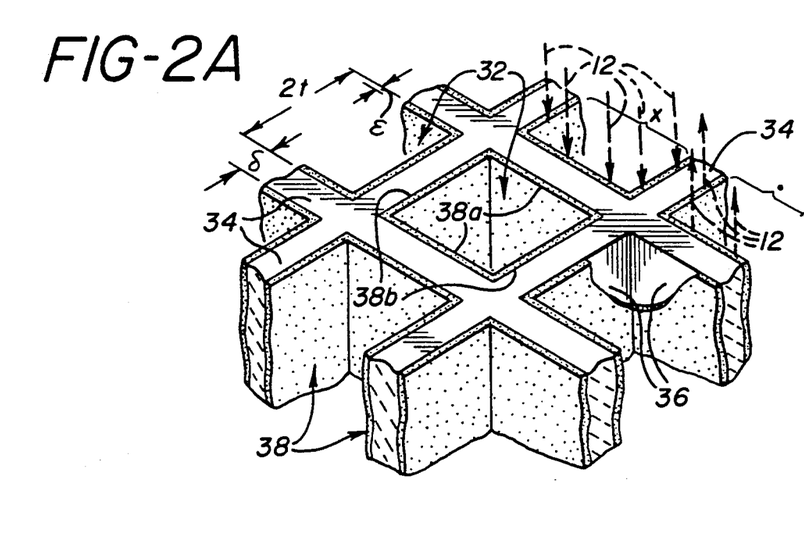
FIG. 2A is an enlarged perspective view of the channels and superconducting films of the present invention.

The honeycomb geometry can be arranged to minimize thermal conductive of downlead 18 and minimize evaporative loss of liquid helium. A single downlead 18 made in accordance with the present invention is shown in greater detail in FIGS. 2 and 2A. A cylindrical ceramic honeycomb body 30 is shown having a plurality of square longitudinal channels 32 (hereinafter referred to for simplicity as "channels") formed by longitudinal walls 34. Films or layers 38 of a superconducting ceramic material are shown in FIG. 2A adhered to the surfaces 36 of each longitudinal wall 34 of substantially all of channels 32 and extend generally the length of body 30. A single downlead 18 as described herein has sufficient capacity to replace multiple downleads used in many prior art applications, and is preferable for simplicity.

In the preferred embodiment of the present invention, ceramics are used to form the body 30 of the honeycomb which exhibit a lattice structure compatible with the lattice structure of superconducting ceramics.

While honeycombs may be made in a variety of ways, because the current carrying capacity of ceramic superconductors generally vary with the axis of the crystal lattice, ceramic honeycomb body 30 is preferably extruded so that the corresponding axis or plane of superconducting films 38 subsequently deposited have maximum current carrying capacity oriented parallel to the extrusion direction.

For example, in the preferred embodiment, ceramic honeycomb body 30 is made of $Bi_3Ti_4O_{12}$ (Bt), extruded by methods known in the art, and superconducting ceramic films 38 are made of BiCaSrCu-oxide (BCSCO). Shown representatively in FIG. 3, BT exhibits lattice constants of a=5.448 angstroms, b=5.441 angstroms and c=32.83 angstroms as reported by S. Ehara et al, Jpn. J. Appl. Phys. 20, 877 (1981). Because of the large aspect ratio for BT, c/a=6 and its tendency to form mica-like platelets, a ceramic honeycomb body may be extruded from reacted BT powders where the a-b plane is oriented parallel to the extrusion direction as described by I. M. Lachman et al and S. L. Swartz et al, cited above.

Figure 3:
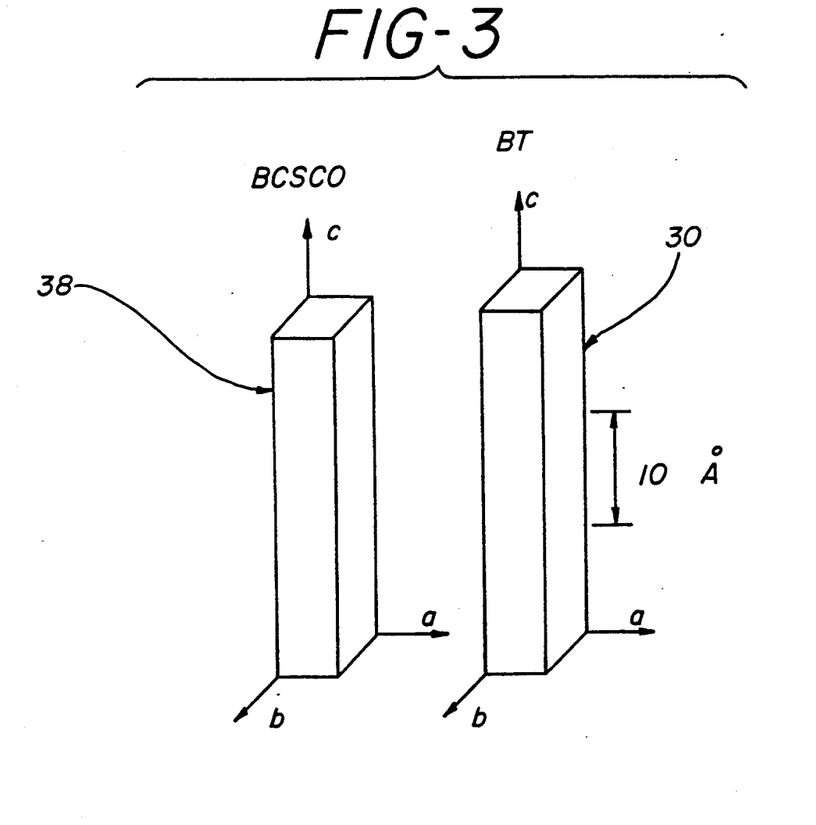
FIG. 3 is a perspective schematic representation of the crystal lattice structure of the preferred ceramic honeycomb and ceramic superconductor.

As also shown in FIG. 3, an almost exact match exists between the lattice constants of BT and BCSCO. BCSCO has lattice constants of a=5.41 angstroms, b=5.44 angstroms and C=30.78 angstroms, as reported by R. M. Hazen et al, Phys. Rev. Lett. 60, 1174 (1988). As a result, films 38 of BCSCO can be grown as substantially single crystals on surfaces 36 of longitudinal walls 34 by methods known in the art, such as the liquid-phase-epitaxy method (LPE). Where a-b plane oriented extrusions are used, the maximum current carrying plane of BCSCO films 38 may be grown, as known in the art, so as to be parallel to the extrusion direction to maximize current carrying capacity of the downlead. Films 38 up to 10 microns thick may be so grown, as indicated by H. Takeya and H. Takei, Jpn. J. Appl., Phys. 28, L229 (1989). In the LPE-growth of BCSCO on the BT ceramic, there may be unavoidable doping of $Ti^{4+}$ in BCSCO. However, studies of such doping by K. W. Goeking, et al, Annual Symposium of Electronic Materials Processing and Characterization, APS, MRS and Chem. Soc. June, 1989, have shown that the superconducting properties of BCSCO are improved, not degraded by the doping.

Because superconductivity can be destroyed by sufficiently large external or self-generated magnetic fields, the geometry and current flow in the honeycomb body 30 has been designed to produce advantageous magnetic field cancellations. As shown in FIGS. 2 and 2A, a plurality of square cylindrical channels 32 of downlead 18 can carry current 12 in the positive or negative direction, represented by . and X, respectively. Magnetic fields generated by currents in the various channels 32 have been modeled with physics equations known in the art, and the effect of geometry on field cancellations considered.

Figure 4:
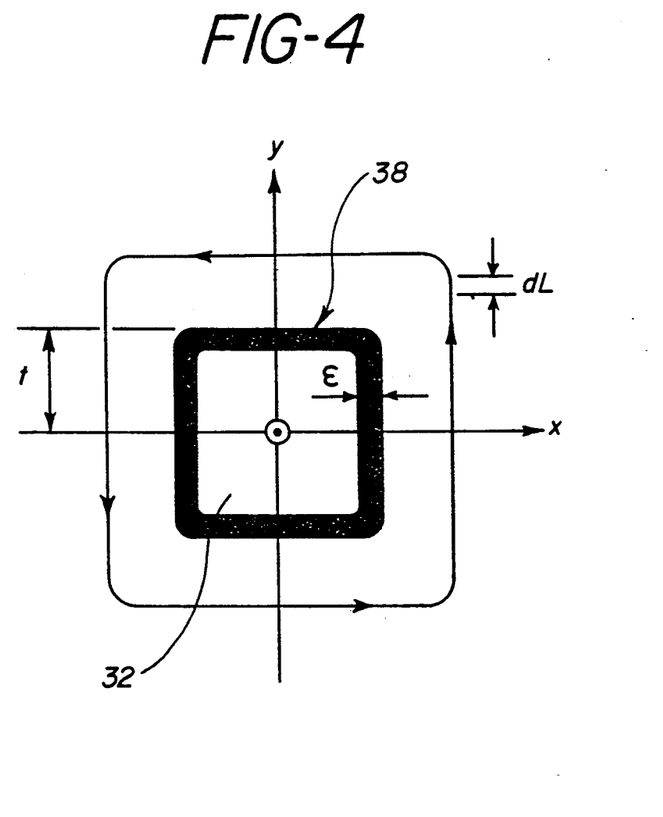
FIG. 4 is a schematic representation of the magnetic field generated by a single honeycomb channel.

An expression for the magnetic fields associated with a single square channel in a honeycomb may be derived from the circuital form of Ampere's law:

$$\int B_o dl = \mu_o i, \text{ where } \mu_o = \text{permeability of free space} \quad (1)$$

which relates the magnetic field to the current i flowing within a loop defined by the path integral. A single honeycomb channel is shown in FIG. 4 where the channel 32 has a half-width t and is coated with a film 38 of thickness $\epsilon$. For simplicity, only the film 38 is considered, and the honeycomb ceramic is treated as a vacuum for calculation purposes. The path $d_l$ outside the film 38 in FIG. 4 is chosen for symmetry reasons to evaluate the integral in Eq. (1), and the field lines are shown according to the right-hand rule. If x and y are measured from the center of the channel 32, and x=y defines the square path, the integral becomes $$4x\, B_y + 4y\, B_x = \mu_0 i. \tag{2}$$

and since $B_x = B_y$ by symmetry, $$B_y = \mu_0 i / 8x \text{ where } x > t \tag{3}$$

$$B_x = \mu_0 i / 8y \text{ where } y > t \tag{4}$$

By symmetry, only the first quadrant need be considered (x>0, y>0). Eq. (3) shows that the magnetic field $B_y$ in the y-direction at a point external to the film 38 depends only on the distance of the point in the x-direction from the center of the conductor. Eq. (4) shows a similar result for the field in the x-direction. Eqs. (3) and (4) for a square conductor are slight variations of the case of a circular conductor presented in textbooks, such as *Elementary Theory of Electric and Magnetic Fields*, by W. B. Cheston (John Wiley, N.Y. 1964). The field is independent of the thickness of the conductor, $\epsilon$.

Where $x \leq t$, it is straightforward to further show that for a square channel having superconducting film 38 in the channel 32 carrying a sheath of current i, $$B_y = \mu_0 i (x^2 - t^2 + 2t\epsilon)/16x\, t\epsilon \text{ for } x \leq t, \text{ and} \tag{5}$$

$$B_x = \mu_0 i (y^2 - t^2 + 2t\epsilon)/16y\, t\epsilon \text{ for } y \leq t \tag{6}$$

where x and y are measured from the center of the channel 32, t is the half-width of the channel, and $\epsilon$ is the film thickness (an $\epsilon \ll t$ expansion has been used in Eqs. (5) and (6)). Again, for analysis, only the first quadrant (x>0, y>0) needs to be considered by symmetry, and the honeycomb ceramic is treated as a vacuum for simplicity in calculating the magnetic fields.

Figure 5:
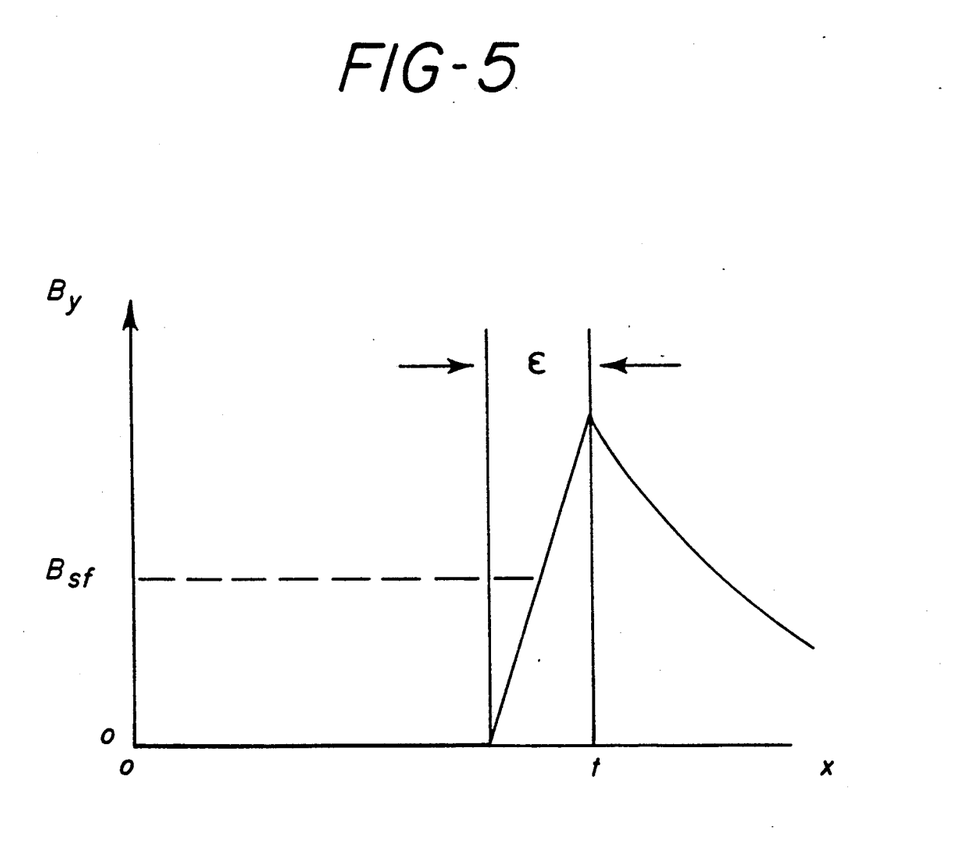
FIG. 5 is a graph showing the magnetic field of the typical channel of FIG. 5A.

Equations (3) and (5) are plotted in FIG. 5 for a typical channel 32, as shown in FIG. 4. At the inner surface of the film, $x = y = t - \epsilon$, the magnetic field vanishes, (as is the case with circular conductors), and by symmetry, $B_x = B_y = 0$. At the outer surface of the film, $x = y = t$, $B_x = B_y = \mu_0 i / 8t$.

At large distances from the center of the channel 32 the field lines approach, and eventually become, circles rather than squares. These roundings of the field lines are ignored here.

Figure 6:
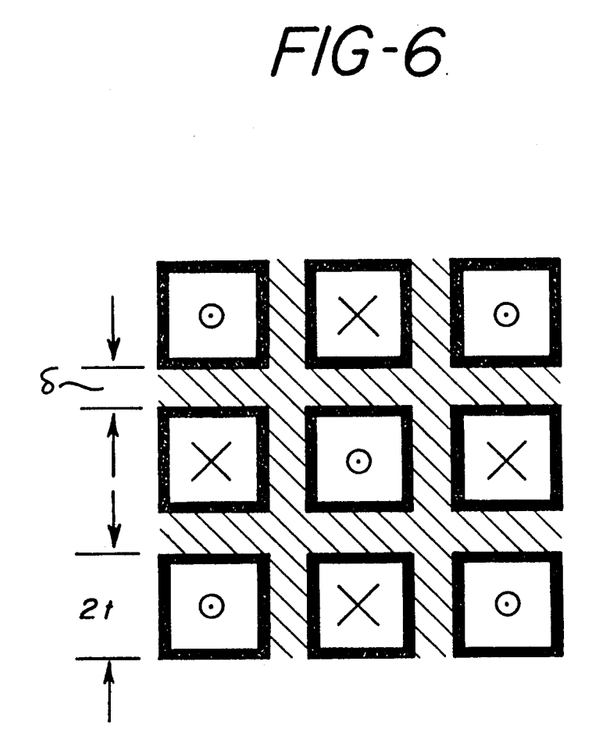
FIG. 6 is a schematic representation of oppositely-directed current flows in a "checkerboard" design.

It is convenient to define the longitudinal self-field in the film as the mean value of the magnetic field in the y-direction in the film, shown in FIG. 6 at the midpoint of the film, $x = t - \epsilon/2$, to wit:

$$B_{sf} = \mu_0 i / 16t \tag{7}$$

As seen in Eq. (7), and FIG. 5, this field varies linearly through the film 38. Self-induced fields in the films need to be considered in both the longitudinal and transverse directions of the films.

Figure 7:
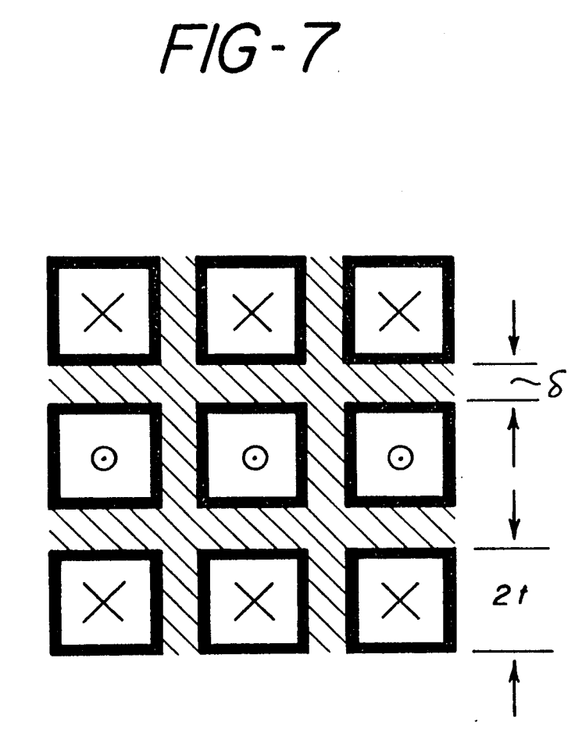
FIG. 7 is a schematic representation of oppositely-directed current flows in a "stripe" design of alternating rows.

A plurality of square channels 32 may next be examined to define parameters which will lead to cancellation of the longitudinal self-field of Eq. (7). Two possible highly symmetric current distributions are illustrated in FIGS. 6 and 7 and discussed as Examples 1 and 2 below—a "checkerboard" arrangement and a "stripe" arrangement, respectively. In the checkerboard arrangement, alternating channels carry oppositely-directed currents, and in the stripe arrangement, alternating rows of channels carry oppositely-directed currents. The opposite directions of the currents are indicated by . and x in FIGS. 6 and 7. The wall thickness of the honeycomb, $\delta$, is shown in FIGS. 6 and 7. (See also FIG. 2.A.)

For convenience, two dimensionless quantities may be defined. First, a field factor, $$\beta = \frac{B}{B_t} = 8t\, B / \mu_0 i \qquad \text{Eq. (8)}$$

where B is $B_y$ or $B_x$, and $B_t$ is the maximum field at x=t or y=t. Thus, for example, referring to FIG. 6, the field factor, $\beta$, for $B_y$ at x=t is unity, and the field factor, $\beta$, in the y-direction for $B_y = B_{sf}$, the self-field is $\frac{1}{2}$.

A second dimensionless quantity, a honeycomb geometry parameter, may be defined as $$\rho = \delta/t \tag{9}$$

EXAMPLE 1

Figure 8:
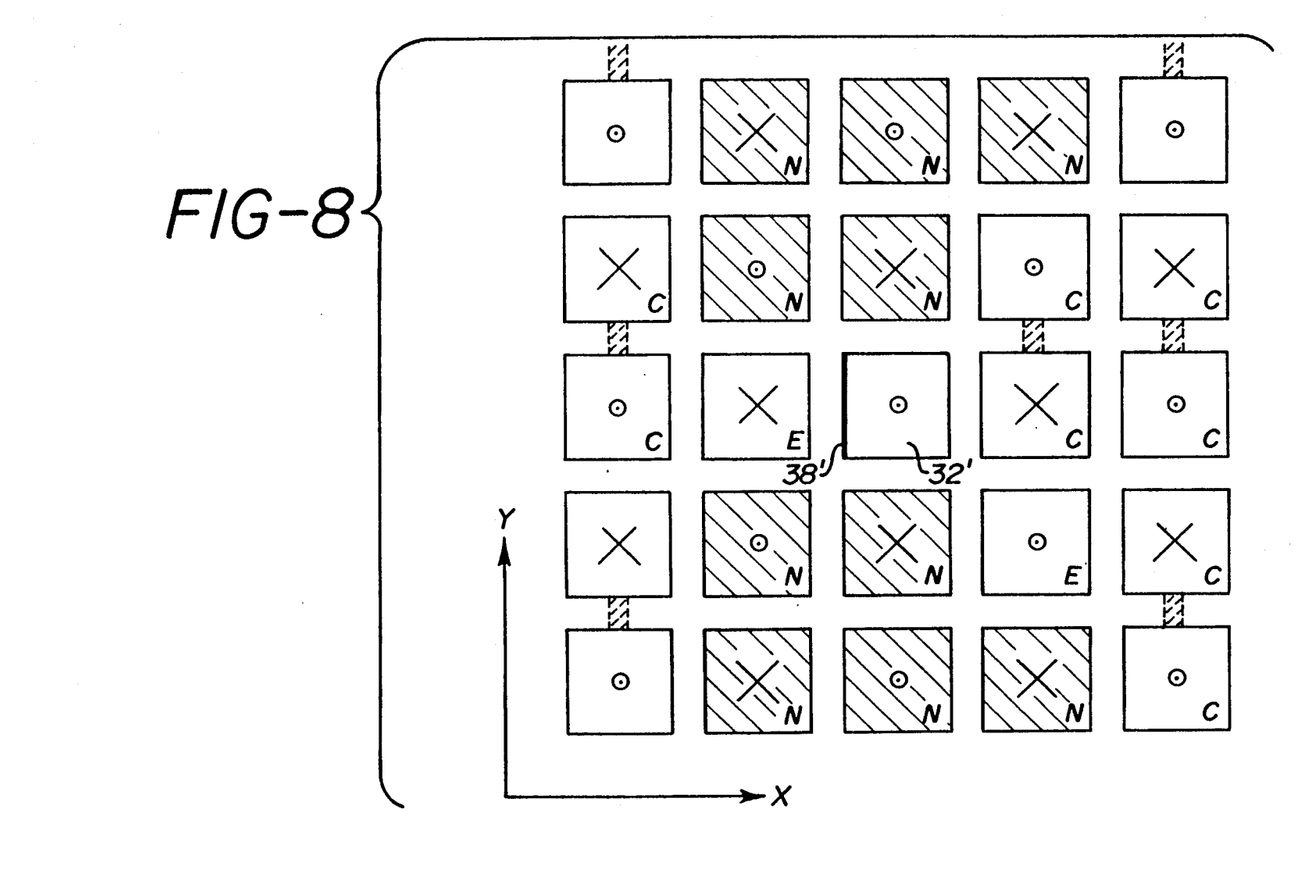
FIG. 8 is a schematic representation of the magnetic fields in the honeycomb for checkerboard current flows.

In the case of the checkerboard current distribution, the symmetrical design shown in FIGS. 6 and 8 permits consideration of just one film 38' in a reference channel 32', as shown in FIG. 8. Consideration of the magnetic fields in the y-direction at 38' generated by neighboring channels 32 reveals that some fields cancel out in pairs (as denoted by C and connecting lines), and other fields generated by other channels simply do not contribute (as denoted as N) to the longitudinal magnetic field $B_y$ at reference film 38'. These conclusions may be reached by inspection of FIG. 8 and consideration of the geometry of generally square fields generated by current flowing in neighboring channels. It may further be seen that the magnetic fields of the remaining films 38 (denoted by E) contribute to, rather than cancel, the longitudinal magnetic field $B_y$ in reference film 38'. The resultant longitudinal field factor for reference film 38' is:

$$\beta_y = -\tfrac{1}{2} - 1/(1+\rho) - 1/(3+\rho) \tag{10}$$

where the leading term represents the longitudinal self-field of reference channel 32', and subsequent terms are field factors $\beta_y$ at film 38' for remaining films 38E.

It is evident that the longitudinal self-field of reference film 38' is enhanced in the checkerboard arrangement, and therefore this design may be eliminated from consideration as the best made of practicing the invention because enhanced magnetic fields will ultimately destroy the superconducting character of ceramic films 38'. Nonetheless, at sufficiently low currents the magnetic fields remain below the threshold fields, and the checkerboard arrangement may be used.

EXAMPLE 2

Figure 9:
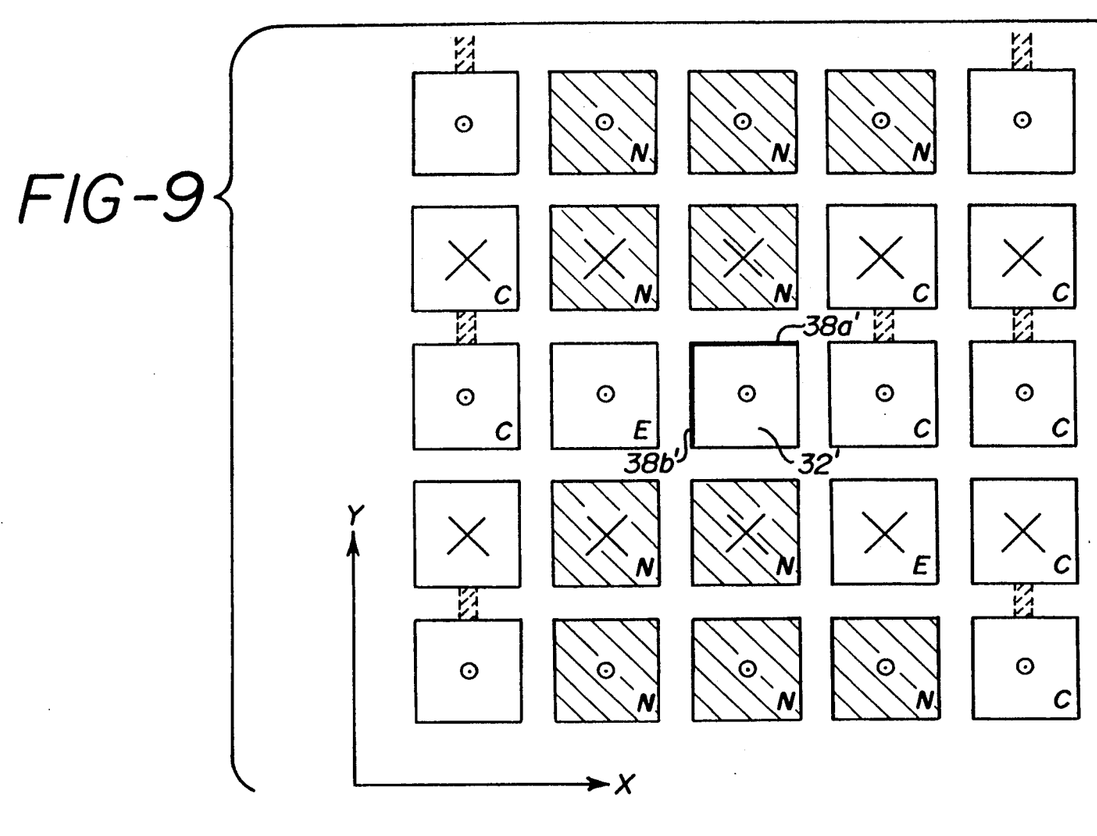
FIG. 9 is a schematic representation of the magnetic fields in the honeycomb for a stripe design of alternating rows.

Turning next to the longitudinal fields in the stripe current distribution of FIGS. 7 and 9, two films in the reference channel 32' are considered because of the two-fold symmetry. Shown in FIG. 9, these two films are labeled 38a' and 38b'.

Proceeding as above, for the $B_y$-fields in film 38a' in FIG. 9, a large number of neighboring channels have fields which are again either non-contributing (denoted by N) or pairwise-cancelling (as denoted by C and connecting lines). Again, only a few films 38 generate fields contributing to the magnetic field at 38a' (as denoted by E in FIG. 9). The resultant longitudinal field factor for the reference film 38a' is $$\beta_y = -\tfrac{1}{2} + 1/(1+\rho) + 1/(3+\rho) \qquad (11)$$

which has the $\beta_y = 0$ solution $$\rho = \sqrt{5}. \qquad (12)$$

This result, substituting in Eq. (9), means that the resultant longitudinal field at the mid-point of film 38a' vanishes if the honeycomb geometry is arranged such that $\delta = \sqrt{5} \, t = 2.24 \, t$.

Turning to consideration of longitudinal fields in film 38b', calculation of the longitudinal ($B_x$) fields in the film 38b' shown in FIG. 9 follows along the lines of the above analyses. (Note that the non-contributing (N) and pairwise-cancelling films (C) and contributing films (E) indicated in FIG. 9 refer only to the $B_y$-fields in film 38a'). Here we find a more complex situation involving $B_x$-contributions from channels throughout the entire honeycomb, and the resultant longitudinal field factor for the film 38b' is approximated by $$\beta_x = -\tfrac{1}{2} - 2\Sigma(-)^{n+1}(2n-1)/[2n-1) + n\rho] \qquad (13)$$

where n is equal to the total number of rows of channels. Equation (13) is an alternating series having an upper bound of the absolute value of 1.5 corresponding to $\rho = 0$, and a lower bound of 0.50 corresponding to $\rho \to \infty$. In any case, the longitudinal self-field in film 38b' is enhanced.

Turning to consideration of transverse magnetic fields in reference films 38a' and 38b', a direct extension of the above analyses shows that the resultant transverse $B_x$-fields in film 38a' and $B_y$-fields in film 38b' cancel exactly by symmetry, independent of $\rho$.

The above analyses clearly favor the stripe current distribution of Example 2 over the checkerboard distribution of Example 1 because of the cancellation of longitudinal fields with the self-field at $\rho = \sqrt{5}$ in film 38a', and the cancellation of transverse fields. While films in film 38b' are enhanced in the stripe design, those in film 38a' may be cancelled, providing a desirable condition for maintaining the superconducting character of ceramic films 38a'. The results of these field analyses are summarized in FIG. 10 where the resultant longitudinal field factors are plotted vs. $\rho$ for the three cases considered. Equation (13) was calculated to convergence on a computer to construct FIG. 10, and the $\beta = \pm \tfrac{1}{2}$ factor for the self-field of a single channel is shown for comparison. For clarity, the absolute value of Eq. (13) (an alternating series) is plotted in FIG. 10.

Figure 10:
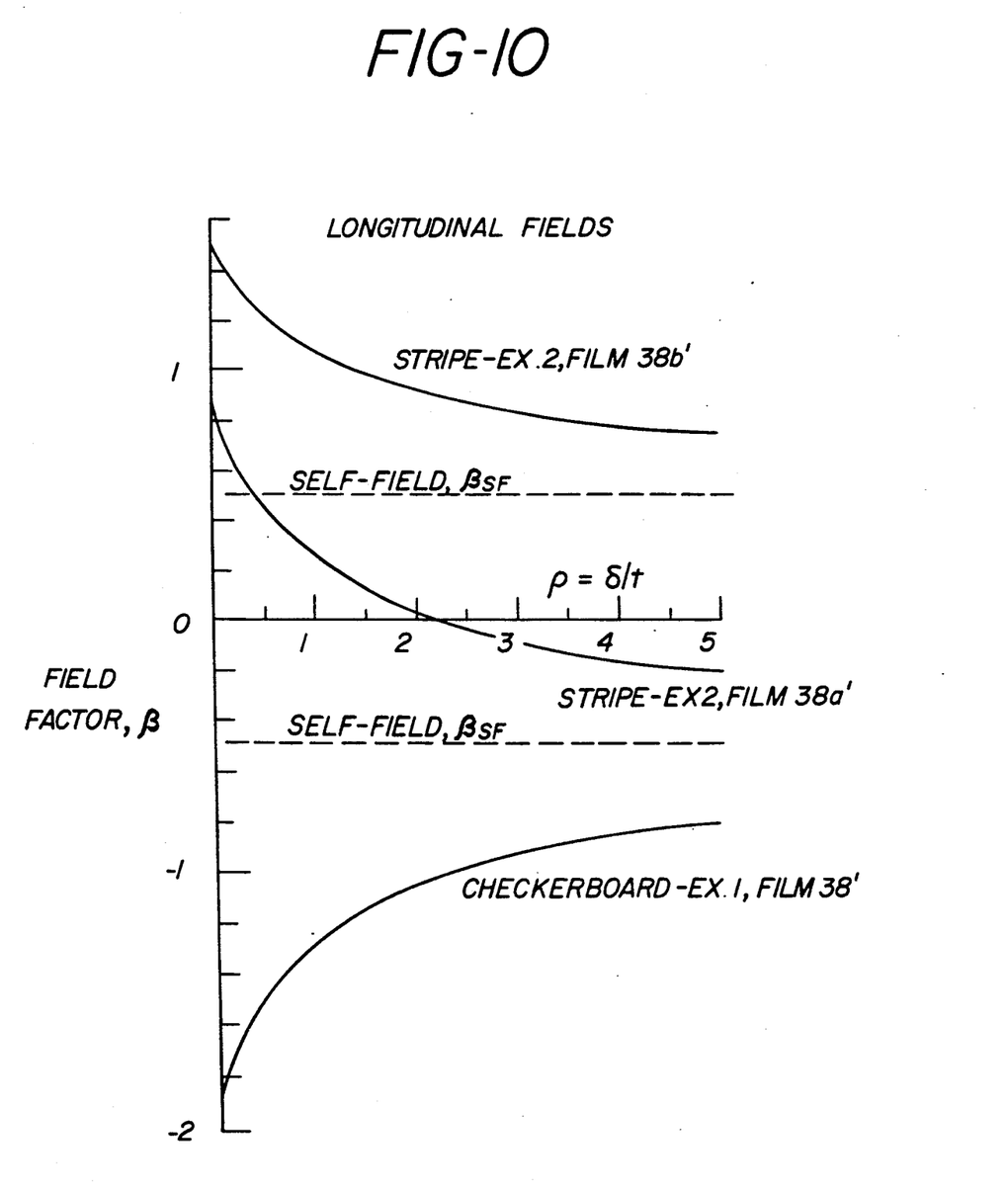
FIG. 10 is a graph showing the magnetic fields in the reference films of FIGS. 8 and 9.

The data in FIG. 10 show interesting comparisons of the resultant field factors for the two current distributions. The $\beta$-factors for the checkerboard (Ex. 1. 38') and stripe cases (Ex. 2. 38b') cases decrease (in absolute value) as $\rho$ increases, but $\rho$-values above, say, 5 become impractical for the honeycomb-extrusion process as is well-known in the art, whereas $\rho = \sqrt{5}$ is a very practical value. Therefore, it is not possible to achieve significant reductions in the resultant field in the films 38 except in the case of the stripe film 38a'.

Thus, in the present invention the pattern or grouping of direct current flows in channels 32, and the shape, size and spacing of channels 32 have been optimized to reduce the resulting magnetic fields' effect on films 38 of superconducting ceramic.

In the preferred embodiment of the invention as illustrated in FIGS. 2 and 2A, oppositely directed currents 12 are grouped in a striped pattern of alternating rows of square channels 32 transversely across the face of ceramic honeycomb body 30. The precise geometry in cross section of the ceramic honeycomb body 30 comprises square channels 32 of width 2 t separated by longitudinal walls 34 having a thickness $\sqrt{5}$ t where t is defined as the half-width of a honeycomb channel 32. The overall size and length of the honeycomb body 30, thickness of the longitudinal walls 34 and width of channels 32 depend on the application. For example, where total currents in the range of 75K amps are required, the distance t is typically in the range of 1 mm to 2 mm. LPE methods to grow films 38 up to 10 microns thick on surfaces 36 may be used without clogging channels 32. The current carrying capacity of BCSCO films in the a-b plane is known to be $> 10^6$ Amps/cm$^2$.

By virtue of such an arrangement, total currents in excess of 75K amps in films up to 10 microns thick, preferably 2 to 5 microns, can thereby be carried in downlead 18. As shown in FIG. 2 and 2A, films 38 cover all four longitudinal walls 34 of channels 32, and are further identified as 38a and 38b. (See also FIG. 9) Films 38a are perpendicular and films 38b are parallel to the direction of the alternating rows of channels 32 of the preferred embodiment. As demonstrated above, magnetic field cancellations for square channels grouped in a striped pattern of alternating rows are such that currents as high as 75K amps may drive thin films 38b normal (non-superconducting), while films 38a remain superconducting. However, at sufficiently low currents e.g., generally $\tfrac{1}{3}$ of those which result in a threshold field in film 38a, films 38b will also remain superconducting.

Longitudinal channels having cross sections other than square, such as triangles, rectangles, etc., are possible, and consequently other than striped arrangements may be possible, but are not preferred. The field effects of such alternative geometries may be calculated by equations known in the art to determine the designs which will minimize the net magnetic fields.

While the geometry of the preferred embodiment is controlled by electrical and magnetic field considerations, longitudinal walls 34 of body 30 are nonetheless of sufficiently narrow width to result in a cross-sectional area sufficiently small that thermal conductance down body 30 remains at acceptable levels. Because of the relative size of longitudinal walls 34 compared to films 38, the thermal conductance of body 30, though small, far exceeds that of films 38. The thermal conductivity of the BT ceramic, a ferroelectric, is believed to be small, exhibiting almost glasslike behavior at low temperatures. To further improve the low thermal conductivity of BT, additives, such as SiO$_2$, may be introduced into the ceramic, as is known in the art. However, such additives in proper amounts do not interfere with the desirable lattice characteristics. In addition to low thermal conductance, by virtue of the large surface area presented by many channels, the honeycomb design optimizes the heat transfer between downlead 18 and gaseous helium 28' generated by evaporation. As a result, ceramic downleads 18 according to the present invention, minimize undesirable liquid helium evaporation losses associated with copper busbars used as downleads in the prior art.

According to another aspect of the invention, a method of producing the downlead 18 is disclosed. The method comprises the steps of extruding a ceramic honeycomb body 30 having a plurality of parallel longitudinal channels 32; and growing one or more substantially single crystals of ceramic superconductor 38 having a substantially identical lattice structure to that of the ceramic honeycomb, on one or more surfaces 36 of one or more of the longitudinal walls 34 of channels 32. The method preferably further includes extruding ceramic honeycomb body 30 with a given axis or plane of the crystal lattice of the ceramic honeycomb body 30 aligned in the direction of extrusion, and growing the one or more substantially single crystals of ceramic superconductor 38 with similar alignment, so that the axis or plane of maximum current carrying capacity of the superconductor ceramic 38 is oriented in the direction of extrusion.

Where the ceramic honeycomb body 30 itself is composed of a superconducting ceramic such as BCSCO, the current is carried in the outermost layers of the longitudinal walls 34 of channels 32 which will exhibit behavior equivalent to films 38 of superconducting ceramic described above. Alternatively, a film 38 comprised of superconducting ceramic, can also be grown as substantially single crystals on surfaces 36 of longitudinal walls 34 of the superconducting ceramic body 30 by methods known in the art, such as LPE methods.

While certain representative embodiments and details have been shown and described for purposes of illustrating the invention, it will be apparent to those skilled in the art that various changes in the method and apparatus disclosed herein may be made without departing from the scope of the invention which is defined in the appended claims.

What is claimed is:

1. An electrical conductor for use as a downlead to devices operating at low temperatures comprising:
    a ceramic honeycomb body having a plurality of longitudinal channels formed therethrough by longitudinal walls; and
    at least one film of a ceramic superconductor material disposed on at least one surface of at least one of said longitudinal channels, said at least one film extending substantially the length of said one of said longitudinal channels;
    wherein the materials of said ceramic honeycomb body and said ceramic superconductor material are different; and
    wherein the crystal lattice of said ceramic honeycomb body and the crystal lattice of said ceramic superconductor material substantially match, and at least portions of said respective crystal lattices are in substantial alignment.

2. An electrical conductor as recited in claim 1 wherein the crystal lattice of said ceramic superconductor is oriented so that the axis having the maximum current carrying capacity is parallel to the longitudinal axis of said longitudinal channels.

3. An electrical conductor as recited in claim 1 wherein the crystal lattice of said ceramic superconductor is oriented so that the plane having the maximum current carrying capacity is parallel to the longitudinal axis of said longitudinal channels.

4. An electrical conductor as recited in claim 1 wherein said at least one film comprises substantially single crystals of said ceramic superconductor material.

5. An electrical conductor as recited in claim 4 wherein the crystal lattices of said substantially single crystals are oriented so that the axis of said substantially single crystals having the least current carrying capacity are generally perpendicular to the longitudinal axis of said longitudinal channels.

6. An electrical conductor as recited in claim 4 wherein said at least one film is a substantially single crystal of BiCaSrCu-oxide ceramic superconductor.

7. An electrical conductor as recited in claim 6 wherein said ceramic honeycomb body is comprised of $Bi_3Ti_4O_{12}$.

8. An electrical conductor as recited in claim 1 wherein said at least one film of ceramic superconductor material has a thickness in the range from substantially 1 micron to substantially 10 microns.

9. An electrical conductor as recited in claim 1 wherein said ceramic honeycomb body comprises $Bi_3Ti_4O_{12}$.

10. An electrical conductor as recited in claim 9 wherein said ceramic honeycomb body is extruded, and wherein the longest axis of the crystal lattice of said $Bi_3Ti_4O_{12}$ is substantially perpendicular to the direction of extrusion.

11. An electrical conductor as recited in claim 1 wherein said at least one film comprises substantially single crystals of BiCaSrCu-oxide ceramic superconductor oriented so that the axis of said substantially single crystals having least current carrying capacity is generally perpendicular to the longitudinal axis of said longitudinal channels.

12. An electrical conductor as recited in claim 1 wherein said ceramic honeycomb body is extruded.

13. An electrical conductor as recited in claim 12 wherein said ceramic honeycomb body is cylindrical.

14. An electrical conductor as recited in claim 13 wherein said longitudinal channels have generally square cross-sections.

15. An electrical conductor as recited in claim 1 wherein said ceramic superconductor material is doped with titanium.

16. An electrical conductor as recited in claim 1 wherein said ceramic honeycomb body further includes thermal conductivity reducing additives.

17. An electrical conductor as recited in claim 1 wherein said electrical conductor is adapted to operate at low temperatures and said longitudinal channels are adapted to permit flow-through of low temperature coolants.

18. An electrical conductor as recited in claim 1 furthe comprising means for connecting said at least one film on said ceramic honeycomb body to a source of electrical current.

19. An electrical conductor as recited in claim 1, wherein:
    at least two of said plurality of longitudinal channels each include at least one said film of ceramic superconductor material;
    at least one film in one longitudinal channel carries positive current, and at least one film in another longitudinal channel carries negative current.

20. An electrical conductor as recited in claim 19 wherein said positive and negative current is distributed in a pattern of alternating rows of said longitudinal channels so that consecutive ones of said rows carry oppositely directed current.

21. An electrical conductor as recited in claim 19 further comprising:
    means for connecting said ceramic honeycomb body to a source of electrical current; and said positive and negative current is distributed in said films such that the net effect of magnetic fields generated by said positive and negative currents in said films permit at least partial cancellation of self-induced magnetic fields.

22. An electrical conductor as recited in claim 21 wherein said at least partial cancellation of self-induced magnetic fields permits substantially one half of said films to remain substantially superconducting.

23. An electrical conductor as recited in claim 21 wherein the thickness of said longitudinal partition walls is substantially the square root of five times the half-width of said longitudinal channels.

24. An electrical conductor for use as a downlead to devices operating at low temperatures comprising a ceramic honeycomb body having a plurality of longitudinal channels formed therethrough by longitudinal walls:
wherein at least two of said plurality of longitudinal channels each include at least one film of a ceramic superconductor material on at least one surface thereof extending substantially the length of the longitudinal channel; and
wherein at least one film is adapted for carrying positive current and another film is adapted for carrying negative current in said longitudinal channels, and said positive and negative current is distributed in said films such that the net effect of magnetic fields generated by said positive and negative currents in said films permit substantially at least one half of said films to remain substantially superconducting by virtue of the partial or full cancellation of self-induced magnetic fields.

25. An electrical conductor as recited in claim 24 further comprising means for connecting at least one film adapted for carrying current in one of said longitudinal channels to positive electric current and another film adapted for carrying current in another of said longitudinal channels to negative electrical current, said means for connecting distributing said positive and negative electrical current in a pattern of alternating rows of said longitudinal channels, so that consecutive ones of said rows carry oppositely directed current.

26. An electrical conductor as recited in claim 24 further comprising means for connecting at least one film adapted for carrying current in one of said longitudinal channels to positive electric current and another film adapted for carrying current in another of said longitudinal channels to negative electrical current, said means for connecting distributing said positive and negative electrical current in alternating ones of said longitudinal channels, as in a checkerboard pattern.

27. An electrical conductor as recited in claim 24 wherein said films conduct a total electrical current of at least 75K amps.

28. An eletrical conductor as recited in claim 24 wherein:
said ceramic honeycomb body is comprised of a first ceramic material;
said superconductor material is comprised of a second ceramic material; and
the crystal lattices of said ceramic honeycomb body and said ceramic superconductor material substantially match, and at least portions of said respective crystal lattices are in substantial alignment.

29. An electrical conductor as recited in claim 28 wherein said quantity of superconducting material comprises a film of BiCaSrCu-oxide on the surfaces of said longitudinal wall, and said ceramic honeycomb body is comprised of $Bi_3Ti_4O_{12}$.

30. An electrical conductor as recited in claim 24 wherein:
said ceramic honeycomb body is comprised of ceramic superconductor material, and
said electrical conductor further comprises means for connecting said ceramic honeycomb body to a source of electrical current.

31. An electrical conductor as recited in claim 30 wherein each of said films of said ceramic superconductor material are comrpised of substantially single crystals.

32. An electrical conductor as recited in claim 31 wherein said thin films are substantially 1 micron to substantially 10 microns in thickness.

33. An electrical conductor as recited in claim 24 wherein each of said films are substantially 1 micron to substantially 10 microns in thickness.

34. An electrical conductor as recited in claim 24 wherein the thickness of said longitudinal partition walls is substantially the square root of five times the half-width of said longitudinal channels.

35. An electrical conductor for use as a downlead to devices operating at low temperatures comprising:
a ceramic honeycomb body having a plurality of longitudinal channels formed therethrough by longitudinal walls, wherein:
said ceramic honeycomb body is comprised of ceramic superconductor material; and
wherein ones of said longitudinal channels are adapted to carry positive electrical current and others of said longitudinal channels are adapted to carry negative electrical current in the surfaces thereof, and said positive and negative current is distributed in a pattern of alternating rows of said longitudinal channels so that consecutive ones of said rows carry oppositely directed current; and
means for connecting said ceramic honeycomb body to a source of electrical current.

36. An electrical conductor as recited in claim 35 wherein said longitudinal channels carry said positive and said negative electrical currents in the surfaces thereof in a checkerboard pattern of current distribution.

37. An electrical conductor as recited in claim 35 wherein a plurality of said surfaces of said longitudinal channels are substantially single crystals of superconductor material.

38. An electrical conductor for use as a downlead to devices operating at low temperatures comprising a body including a plurality of superconducting current carrying elements disposed therein substantially in a honeycomb pattern, said current carrying elements disposed in generally parallel, spaced relationship, and extending substantially the length of said body;
wherein at least one group of said current carrying elements is adapted to carry positive current and another group of said current carrying elements is adapted to carry negative current, and said positive and negative current is distributed in said current carrying elements such that the self-induced magnetic fields generated by said positive and negative currents in said current carrying elements permit at least a portion of said current carrying elements to remain substantially superconducting by virtue of at least the partial cancellation of said self-induced magnetic fields.

39. An electrical conductor as recited in claim 38 wherein:
said body comprises a ceramic honeycomb body having a plurality of longitudinal channels formed therethrough by longitudinal walls;
said plurality of superconducting current carrying elements each comprise a quantity of ceramic superconductor material forming a film on at least a portion of the surface of one of said plurality of longitudinal channels of said ceramic honeycomb body; and
the crystal lattices of said ceramic honeycomb body and said ceramic superconductor material substantially match, and at least portions of said crystal lattices of said honeycomb body and said ceramic superconductor material are in substantial alignment.

40. An electrical conductor as recited in claim 39 wherein the thickness of said longitudinal partition walls is substantially the square root of five times the half-width of said longitudinal channels.

41. An electrical conductor as recited in claim 39 wherein the alignment of said crystal lattice of said honeycomb body is oriented to promote the growth of at least one crystal of said superconductor material thereon such that the axis of the crystal lattice of the superconductor material having the maximum current carrying capacity is parallel to the longitudinal axis of said longitudinal channels.

42. An electrical conductor as recited in claim 39 wherein at least one of said films comprises substantially single crystals of said ceramic superconductor material.

43. An electrical conductor as recited in claim 42 wherein said ceramic honeycomb body is comprised of $Bi_3Ti_4O_{12}$, and a plurality of said films comprise substantially single crystals of BiCaSrCu-oxide ceramic superconductor.

44. An electrical conductor as recited in claim 38 wherein:
said positive and negative current is distributed in a pattern of alternating rows of said longitudinal channels so that consective ones of said rows carry oppositely directed current; and
said electrical conductor further includes means for connecting said body to a source of electrical current.

45. An electrical conductor as recited in claim 44 wherein said body and said superconducting current carrying elements are comprised of ceramic superconductor material.

46. An electrical conductor as recited in claim 38 wherein:
said body comprises a ceramic honeycomb body having a plurality of longitudinal channels formed therethrough by longitudinal walls;
said plurality of superconducting current carrying elements each comprise a quantity of ceramic superconductor material forming a film on at least a portion of the surface of one of said plurality of longitudinal channels, and extending substantially the length thereof; and
at least substantially one half of said films remain substantially superconducting by virtue of at least partial cancellation of said self-induced magnetic fields.

47. An electrical conductor as recited in claim 38 wherein said elements have a shape in cross-section which is generally open in the center and which permits partial cancellation of said self-induced magnetic fields.

48. An electrical conductor as recited in claim 47 wherein said elements have generally square cross-section.

* * * * *